(12) United States Patent
Heo

(10) Patent No.: US 12,154,883 B2
(45) Date of Patent: Nov. 26, 2024

(54) APPARATUS FOR BONDING WIRE

(71) Applicant: SAMSUNG ELECTRONICS CO., LTD., Suwon-si (KR)

(72) Inventor: Daewoong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 18/204,717

(22) Filed: Jun. 1, 2023

(65) Prior Publication Data

US 2024/0038717 A1 Feb. 1, 2024

(30) Foreign Application Priority Data

Jul. 28, 2022 (KR) .................. 10-2022-0093813

(51) Int. Cl.
*B23K 20/00* (2006.01)
*H01L 23/00* (2006.01)

(52) U.S. Cl.
CPC ............ *H01L 24/78* (2013.01); *B23K 20/005* (2013.01); *H01L 2224/78621* (2013.01)

(58) Field of Classification Search
CPC ........... H01L 24/78; H01L 2224/78621; H01L 24/85; H01L 2224/78252; H01L 2224/78301; H01L 2224/78821; H01L 2224/78822; B23K 20/005; B23K 20/004; B23K 20/007
(Continued)

(56) References Cited

U.S. PATENT DOCUMENTS 5,971,248 A    10/1999 Koduri
6,006,977 A *  12/1999 Koduri .................. H01L 24/78
                                                156/73.2
(Continued)

FOREIGN PATENT DOCUMENTS

CN       218159980 U  *  12/2022
CN       115313141 B  *   5/2023
(Continued)

OTHER PUBLICATIONS

Gao et al., "An Investigation of Capillary Vibration during Wire Bonding Process," 2008 International Conference on Electronic Packaging Technology & High Density Packaging (ICEPT-HDP 2008), 2008, Total 6 pages.
(Continued)

*Primary Examiner* — Kiley S Stoner
(74) *Attorney, Agent, or Firm* — Sughrue Mion, PLLC

(57) ABSTRACT

A wire bonding apparatus includes a bonding stage, a capillary, a clamp provided with the capillary rotatably installed thereon, and a bonding arm. The clamp includes a housing having an internal space, a first member fixedly installed at an upper end of the internal space of the housing and provided with a first gear unit on a lower surface thereof, a second member fixedly installed at a lower end of the internal space of the housing to be spaced apart from the first member, and provided with a second gear unit on an upper surface thereof, a third member, the third member being provided with a third gear unit corresponding to the first gear unit and a fourth gear unit corresponding to the second gear unit. The capillary is fixedly installed on the third member and rotates in conjunction with the third member.

20 Claims, 6 Drawing Sheets

(58) Field of Classification Search
USPC .................................. 228/4.5, 180.5, 904
See application file for complete search history.

(56) References Cited

U.S. PATENT DOCUMENTS

| | | | |
|---|---|---|---|
| 6,340,112 B1 | 1/2002 | Koduri | |
| 7,100,812 B2 * | 9/2006 | Zhai ...................... | B23K 20/10 |
| | | | 228/180.5 |
| 8,646,675 B2 * | 2/2014 | Lang ...................... | H05K 13/06 |
| | | | 228/180.5 |
| 2001/0027987 A1 * | 10/2001 | Kyomasu ............. | B23K 20/005 |
| | | | 228/110.1 |
| 2006/0175377 A1 * | 8/2006 | Zhai ...................... | H01L 24/85 |
| | | | 228/4.5 |
| 2017/0229419 A1 | 8/2017 | Hashim et al. | |

FOREIGN PATENT DOCUMENTS

| | | | | |
|---|---|---|---|---|
| GB | 1584515 A | * | 2/1981 | ............. H01B 13/02 |
| JP | 6-295941 A | | 10/1994 | |
| JP | 2000232125 A | * | 8/2000 | ............. H01L 24/78 |
| JP | 2003121327 A | * | 4/2003 | |
| JP | 2008-288473 A | | 11/2008 | |
| KR | 10-2007-0076194 A | | 7/2007 | |
| KR | 10-2007-0076195 A | | 7/2007 | |
| KR | 20200106177 A | * | 9/2020 | |

OTHER PUBLICATIONS

Liu et al., "Simulation and Experimental Analysis for a Ball Stitch on Bump Wire Bonding Process above a Laminate Substrate," 2006 Electronic Components and Technology Conference, pp. 1918-1923, 2006.

* cited by examiner

APPARATUS FOR BONDING WIRE

CROSS-REFERENCE TO RELATED APPLICATION(S)

This application claims priority to Korean Patent Application No. 10-2022-0093813, filed on Jul. 28, 2022, in the Korean Intellectual Property Office, the disclosure of which is incorporated by reference in its entirety.

BACKGROUND

The present disclosure relates to a wire bonding apparatus.

Semiconductor packages are manufactured through various processes. For example, a semiconductor package may be manufactured using a sawing process, a die bonding process, a wire bonding process, a molding process, a marking process, and the like.

In this case, the wire bonding process is a process of connecting a pad of a semiconductor chip and a lead of a lead frame to a bonding wire or connecting respective pads of the semiconductor chip to a bonding wire.

A capillary may be an important member of the wire bonding apparatus for performing the bonding process. To improve productivity of the bonding process, increasing the lifespan of the capillary is required.

SUMMARY

Example embodiments provide a wire bonding apparatus capable of increasing the lifespan of a capillary.

According to an aspect of an example embodiment, a wire bonding apparatus includes: a bonding stage; a capillary guiding a bonding wire to a bonding pad of a semiconductor chip seated on the bonding stage; a clamp provided with the capillary rotatably installed thereon; and a bonding arm connected to the clamp; wherein the clamp comprises: a housing having an internal space; a first member fixedly installed at an upper end of the internal space of the housing and comprising a first gear unit on a lower surface thereof; a second member fixedly installed at a lower end of the internal space of the housing to be spaced apart from the first member, and comprising a second gear unit on an upper surface thereof; a third member disposed between the first member and the second member, the third member comprising a third gear unit corresponding to the first gear unit and a fourth gear unit corresponding to the second gear unit; and an elastic member biasing the third member away from the second member, wherein the capillary is fixedly installed on the third member and rotates in conjunction with the third member.

According to an aspect of an example embodiment, a wire bonding apparatus includes: a capillary guiding a bonding wire to a bonding pad of a semiconductor chip; a clamp provided with the capillary rotatably installed thereon, wherein the clamp comprises, a housing having an internal space; a first member fixedly installed on an upper end of the internal space of the housing and provided with a first gear unit on a lower surface thereof; a second member fixedly installed on a lower end of the internal space of the housing to be spaced apart from the first member, and provided with a second gear unit on an upper surface thereof; a third member disposed between the first member and the second member, the third member provided with the capillary fixedly installed thereon; and an elastic member connected to the second member to provide restorative force to the second member, the third member is rotated by the first gear unit of the first member when ascending and is rotated by the second gear unit of the second member when descending, and the third member is configured to be rotated in only one direction.

According to an aspect of an example embodiment, a wire bonding apparatus includes: a bonding stage; a clamp; a capillary rotatably installed on the clamp and configured to guide a bonding wire to a bonding pad of a semiconductor chip seated on the bonding stage; a bonding arm connected to the clamp; wherein the clamp comprises: a housing having an internal space; a first member installed at an upper end of the internal space of the housing and comprising a first gear unit at a lower surface thereof; a second member installed at a lower end of the internal space of the housing and comprising a second gear unit on an upper surface thereof; a third member disposed between the first member and the second member and movable relative to the first member and the second member, the third member comprising a third gear unit configured to selectively engage the first gear unit and a fourth gear unit configured to selectively engage the second gear unit; and wherein the capillary is installed on the third member and rotates in conjunction with the third member.

BRIEF DESCRIPTION OF DRAWINGS

The above and other aspects and features will be more apparent from the following description, taken in conjunction with the accompanying drawings, in which.

DETAILED DESCRIPTION

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
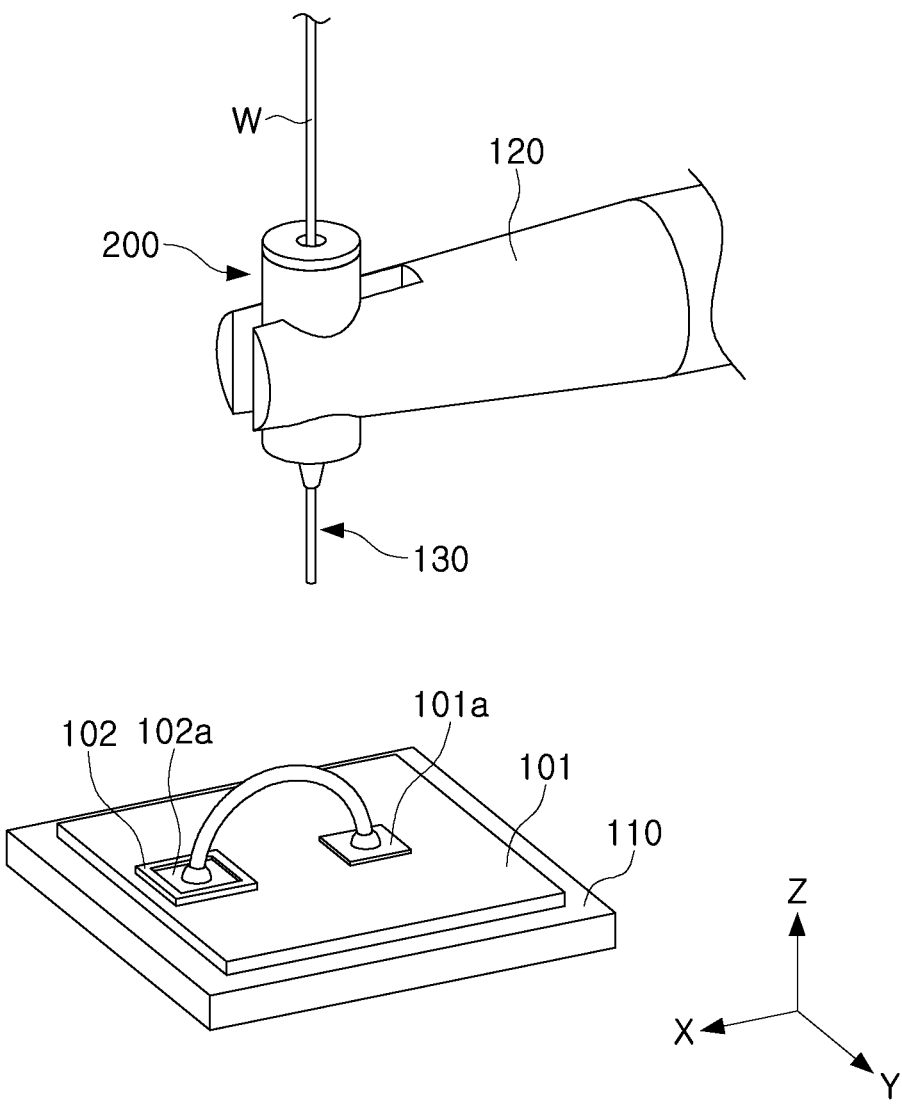
FIG. 1 is a schematic configuration diagram showing a wire bonding apparatus according to an example embodiment.

FIG. 1 is a schematic configuration diagram showing a wire bonding apparatus according to an example embodiment.

Referring to FIG. 1, a wire bonding apparatus 100 according to an example embodiment includes a bonding stage 110, a bonding arm 120, a capillary 130, and a clamp 200.

A substrate 101 may be mounted on the bonding stage 110, and the semiconductor chip 102 is mounted on the substrate 101. In this case, in the case of the lead 101a of the substrate 101, the bonding pads 102a of the semiconductor chip 102 may be electrically connected to each other by the bonding wire W. On the other hand, the bonding wire (W) may include a conductive material such as gold (Au), silver (Ag), platinum (Pt), aluminum (Al), copper (Cu), palladium (Pd), nickel (Ni), cobalt (Co), chromium (Cr) or titanium (Ti).

In addition, the semiconductor chip 102 may include, for example, various memory chips, control chips, driver chips, microprocessor chips, and the like. The semiconductor chip 102 may be, for example, any chip manufactured by a semiconductor process. Furthermore, the semiconductor chip 102 may be included in a display device such as an LCD device and an LED device or other devices using a semiconductor chip.

The substrate 101 may include a substrate used in memory devices, such as a memory board, a control board, a memory stick card, a smart media card (SM), a secure digital card (SD), a mini secure digital card (mini SD), or a multimedia card (MMC).

As an example, the bonding stage 110 may heat the bonding pad 102a of the semiconductor chip 102 and the lead 101a of the lead frame when the wire bonding process is performed. As such, it is heated by the bonding stage 110 to transfer thermal energy to the bonding wire W to form a ball. Also, as an example, the bonding stage 110 may be movable on the X-Y plane. However, the present example embodiment is not limited thereto, and the bonding wire W may be guided to the bonding regions while the capillary 130 moves between the bonding regions.

The bonding arm 120 is provided with a clamp 200 fixed to the end portion. The capillary 130 is rotatably installed on the clamp 200. The clamp 200 may be raised and lowered and the capillary 130 installed on the clamp may be raised and lowered along with the clamp. The bonding arm 120 may be provided with an ultrasonic horn (not illustrated) to excite the capillary 130 through the ultrasonic horn.

The capillary 130 guides the bonding wire W to the bonding pad 102a of the semiconductor chip 102 seated on the bonding stage 110 and the lead 101a of the substrate 101. The bonding pad 102a and the lead 101a are electrically connected. To this end, the capillary 130 may be provided with a through-hole (not illustrated) penetrating in the direction of the center line. Further, the bonding wire W may be guided to the bonding pad 102a of the semiconductor chip 102 and the lead 101a of the substrate 101 through the through-hole.

The capillary 130 may be rotatably installed in the clamp 200, and may be fixedly installed at an end of the bonding arm 120.

Hereinafter, the clamp 200 will be described in more detail with reference to the drawings.

Figure 2:
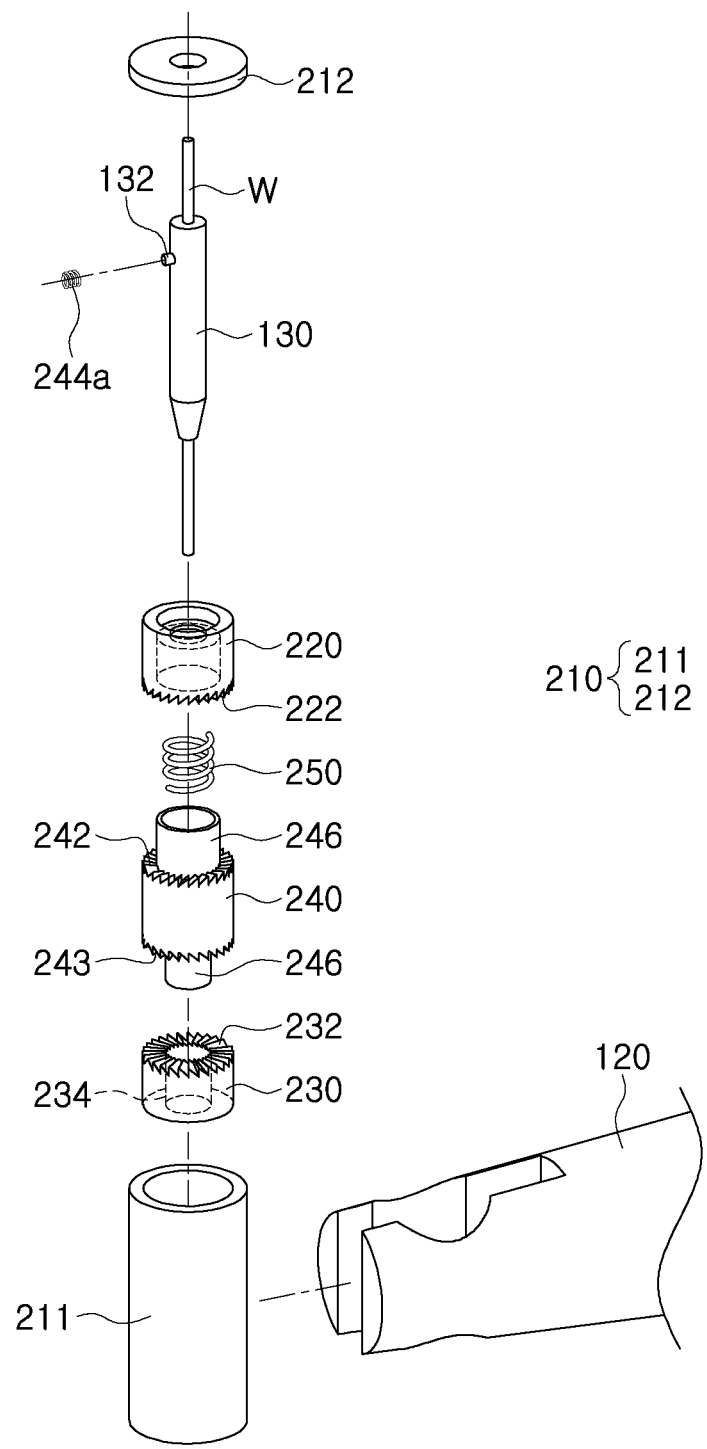
FIG. 2 is an exploded perspective view showing a clamp and a capillary according to an example embodiment.
Figure 3:
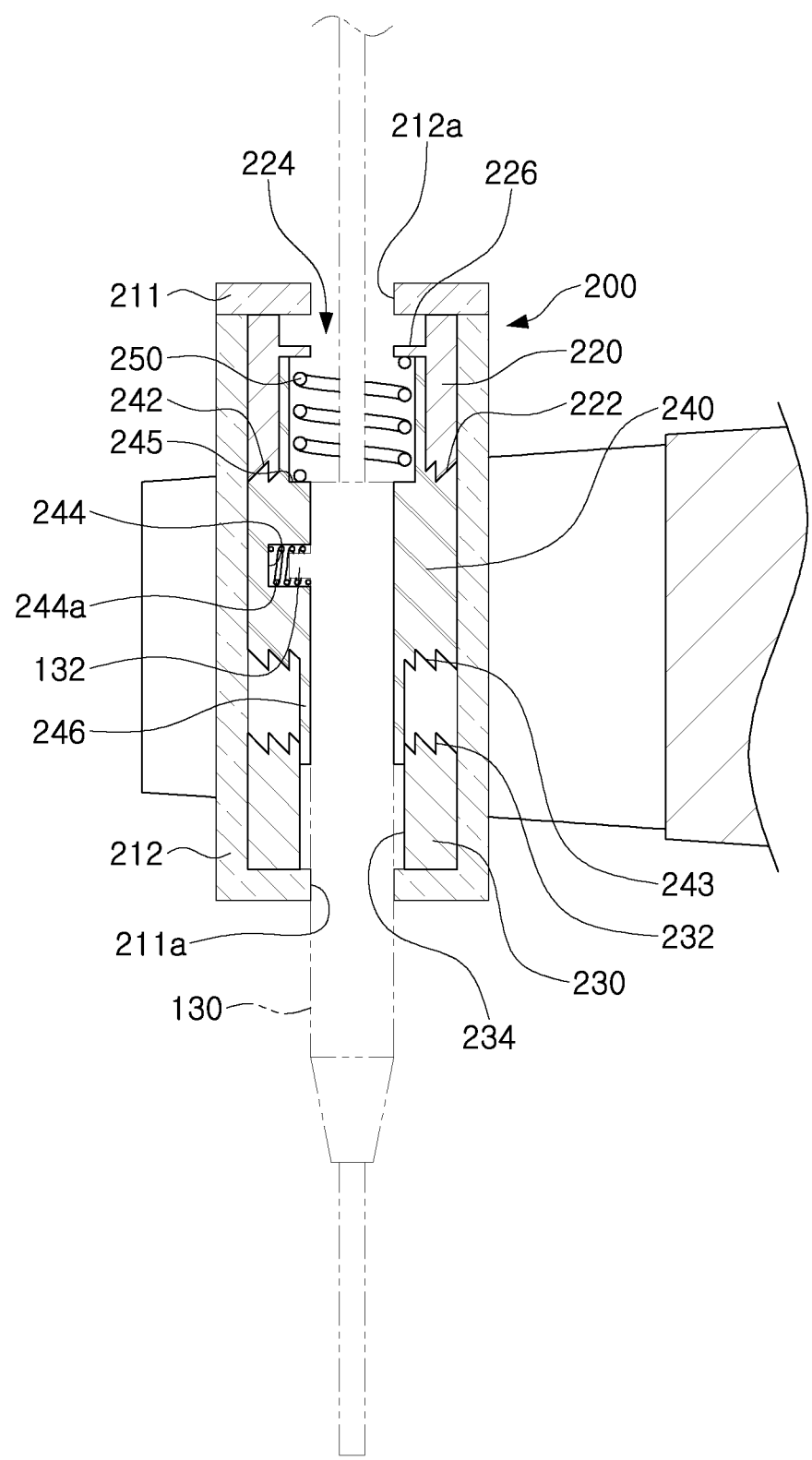
FIG. 3 is a cross-sectional view showing a clamp according to an example embodiment.

FIG. 2 is an exploded perspective view showing a clamp and a capillary according to an example embodiment, and FIG. 3 is a cross-sectional view showing a clamp according to an example embodiment.

Referring to FIGS. 2 and 3, the clamp 200 includes, as an example, a housing 210, a first member 220, a second member 230, a third member 240, and an elastic member 250.

The housing 210 includes body 211 and cover 212 and has an internal space. The first member 220, the second member 230, the third member 240 and the elastic member 250 are disposed in the internal space of the housing 210, and the bonding wire W may pass through the housing 210. For example, the body 211 of the housing 210 may have an open upper surface and a cover 212 closing an upper end of the body 211. Additionally, an opening 211a may be formed in the lower surface of the body 211, such that the capillary 130 protrudes through the opening 211a A through-hole 212a may be provided in the cover 212 to allow the bonding wire W to pass therethrough.

The first member 220 of the example embodiment is fixedly installed at the upper end of the internal space of the housing 210, and may include a first gear unit 222 on a lower surface of the housing 210. The first gear unit 222 serves to rotate the third member 240 in one direction while being coupled to the third member 240 when the third member 240 moves upward. A detailed description thereof is be provided below. As an example, the first member 220 may have a hollow cylindrical shape through which the bonding wire W may pass therethrough (refer to FIG. 1). The first member 220 may also include a first through-hole 224 to allow the bonding wire W to pass therethrough. The first member 220 may be provided with a protrusion 226 protruding from the inner surface to support one end of the elastic member 250.

The second member 230 may be spaced apart from the first member 220, and may be fixedly installed at the lower end of the internal space of the housing 210. The second member 230 serves to rotate the third member 240 in one direction while being coupled to the third member 240 when the third member 240 is lowered, as described below. To this end, a second gear unit 232 may be provided on the upper surface of the second member 230, the second gear unit 232 being configured to engage with the fourth gear unit 243 of the third member 240. A detailed description thereof provided below. a second through-hole 234 may be provided in the second member 230 to allow the capillary 130 to pass therethrough.

The third member 240 is disposed between the first member 220 and the second member 230 in the internal space of the housing 210. The third member 240 may be raised and lowered in the internal space of the housing 210. A third gear unit 242 corresponding to the first gear unit 222 of the first member 220 is provided on the upper surface of the third member 240, and a fourth gear unit 243 corresponding to the second gear unit 232 of the second member 230 may be provided on a lower surface of the third member 240. The capillary 130 may be fixedly installed on the third member 240 and rotate in conjunction with the third member 240. To this end, the third member 240 is provided with a coupling groove 244 into which the protrusion 132 of the capillary 130 is inserted. A spring 244a may be provided inside the coupling groove 244, such that the capillary 130 is biased towards and may be returned to a predetermined position. As described above, the capillary 130 is fixed to the third member 240 while the protrusion 132 of the capillary 130 is inserted into the coupling groove 244 of the third member 240. Accordingly, the capillary 130 may be lifted and rotated in conjunction with the third member 240 when the third member 240 is lifted and rotated. In addition, since the third member 240 and the capillary 130 are connected by the spring 244a, an unnecessary rotation may be prevented by biasing the capillary 130 towards a surface of the third member 240 and so reducing the distance between the capillary 130 and the third member 240.

On the other hand, the third member 240 may include an extension portion 246 extending in the up and down directions into the first and second members 220, 230. A downward projection portion of the extension portion 246 is disposed radially inwardly of the third gear unit 242 and an upward projection portion of the extension portion 246 is disposed radially inwardly of the fourth gear unit 243 and. The extension part 246 serves to guide the third member 240 to be moved along the first and second members 220 and 230 when the third member 240 translates upwardly and downwardly relative to the first member 220 and the second member 230.

As illustrated in, for example, FIG. 3, the teeth of the first gear unit 222 of the first member 220 and the third gear unit 242 of the third member 240 have a right-angled triangular shape in cross section. Accordingly, when the third member 240 rises and the third gear unit 242 is coupled to the first gear unit 222, the third member 240 is coupled to and rotates with the first member 220. As the third gear unit 242 is coupled along the inclined surface of the first gear unit 222, the third member 240 is rotated in one direction. In more detail, when the wire bonding process is performed, the capillary 130 presses the bonding wire W to connect the bonding pad 102a of the semiconductor chip 102 and the lead 101a of the lead frame. The third member 240 may be raised by the pressing force. As the third gear unit 242 of the third member 240 is coupled to the first gear unit 222 of the first member 220, the third member 240 is rotated in one direction. Accordingly, the capillary 130 fixedly installed on the third member 240 may rotate together with the third member 240.

The teeth of the first gear unit 222 of the first member 220 and the third gear unit 242 of the third member 240 may have the same gear ratio. However, example embodiments are not limited thereto, and the gear ratio of the third gear unit 242 may be increased or decreased relative to the gear ratio of the first gear unit 222 such that the teeth of the first gear unit 222 of the first member 220 and the third gear unit 242 of the third member 240 may not have the same gear ratio.

In addition, cross sections of the second gear 232 of the second member 230 and the fourth gear 243 of the third member 240 may have a right-angled triangular shape. Accordingly, when the third member 240 descends and the fourth gear unit 243 is coupled to the second gear unit 232 the third member 240 is rotated in one direction while the fourth gear unit 243 is coupled along the inclined surface of the second gear unit 232. The third member 240 may be lowered by the biasing force of the elastic member 250.

In detail, to connect the bonding wire W to the bonding pad 102a of the semiconductor chip 102 and the lead 101a of the lead frame, when the capillary 130 presses the bonding pad 102a while the bonding arm 120 is rotated, the third member 240 is raised by the pressing force, and at this time, the elastic member 250 is compressed by the third member 240. Thereafter, when the wire bonding process is completed and the capillary 130 rises by the bonding arm 120, the third member 240 is lowered by the biasing force of the elastic member 250. As the fourth gear unit 243 is coupled along the inclined surface of the second gear unit 232, the third member 240 is rotated in one direction. The capillary 130 is fixedly installed on the third member 240 and so rotates together with the third member 240.

The teeth of the second gear unit 232 of the second member 230 and the fourth gear unit 243 of the third member 240 may have the same gear ratio. However, example embodiments are not limited thereto, and the gear ratio of the fourth gear unit 243 may be increased or decreased relative to the gear ratio of the second gear unit 232, such that the teeth of the second gear unit 232 of the second member 230 and the fourth gear unit 243 of the third member 240 may not have the same gear ratio.

The elastic member 250 has one end supported on the protruding support 226 of the first member 220 and the other end supported on an upper surface 245 of the third member 240. Accordingly, when the third member 240 is raised, the elastic member 250 is compressed, and when the force applied to the third member 240 is removed, the third member 240 is lowered by the restorative force of the elastic member 250. As an example, the elastic member 250 may be a coil spring. However, the example is not limited thereto, and the elastic member 250 may be various types of springs or other elastic members deformed when a force is applied thereto and returning to an original shape thereof when the force is removed.

As described above, the lifespan of the capillary 130 may be increased by rotating the capillary 130 in one direction in association with the second member 230 according to the elevation of the second member 230. For example, since the positive voltage applied to the capillary 130 is uniformly applied as the capillary 130 rotates, it is possible to reduce the stress concentration generated by the spark being unbalanced. Accordingly, it is possible to reduce the build-up generated by being biased on the capillary 130, for example, the deposition of foreign substances. It is possible to increase the lifespan of the capillary 130.

Furthermore, by reducing the build-up generated by being biased toward the capillary 130, it is possible to reduce the formation of a free air ball (FAB) that is biased when forming the free air ball (FAB). Accordingly, it is possible to reduce the problem of ball deformation occurring during the wire bonding process.

Hereinafter, the capillary rotation driving will be described in more detail with reference to the drawings.

Figure 4:
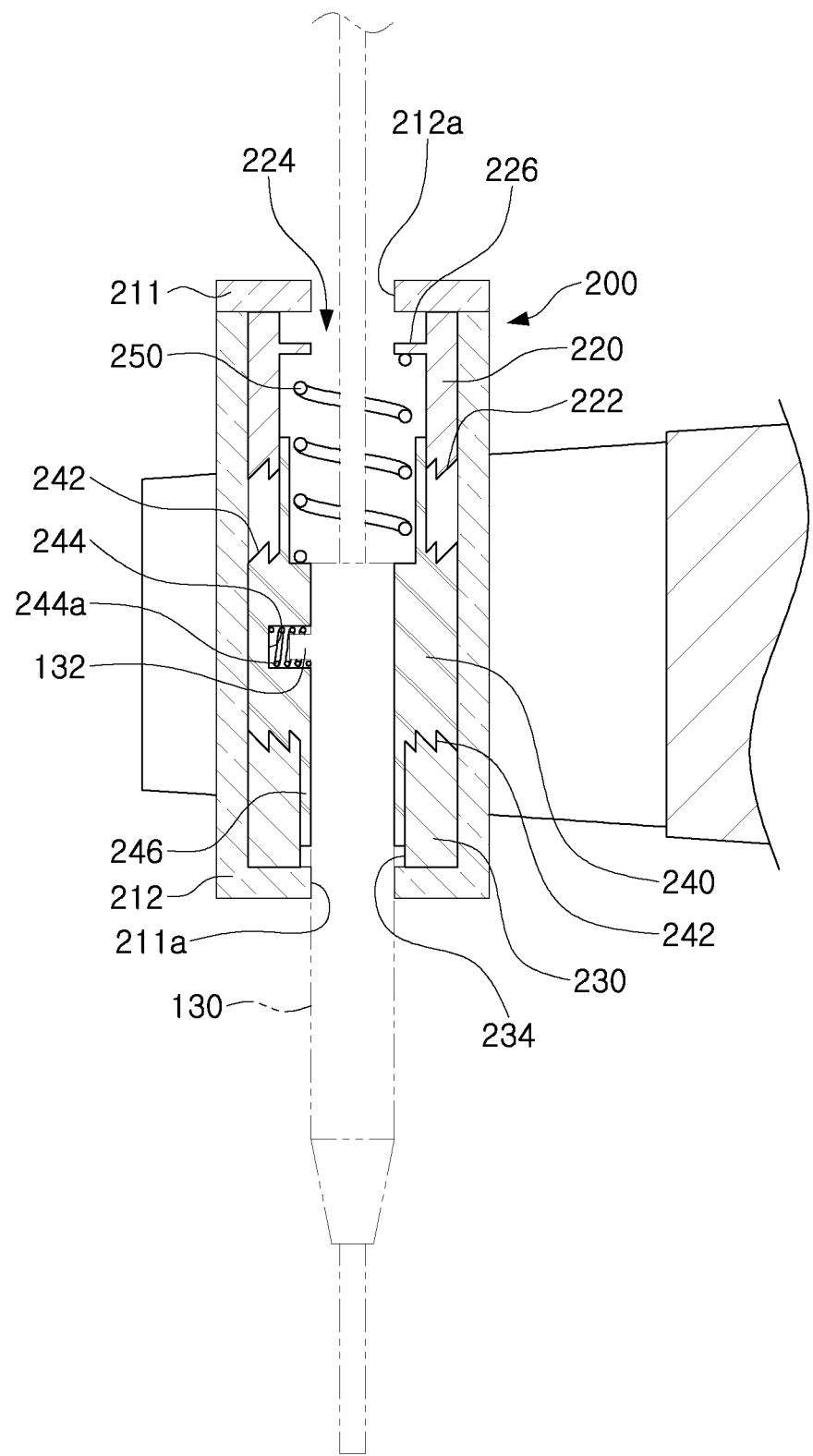
FIGS. 4 to 6 are explanatory views for explaining the operation of the clamp and the capillary according to the example embodiment.
Figure 5:
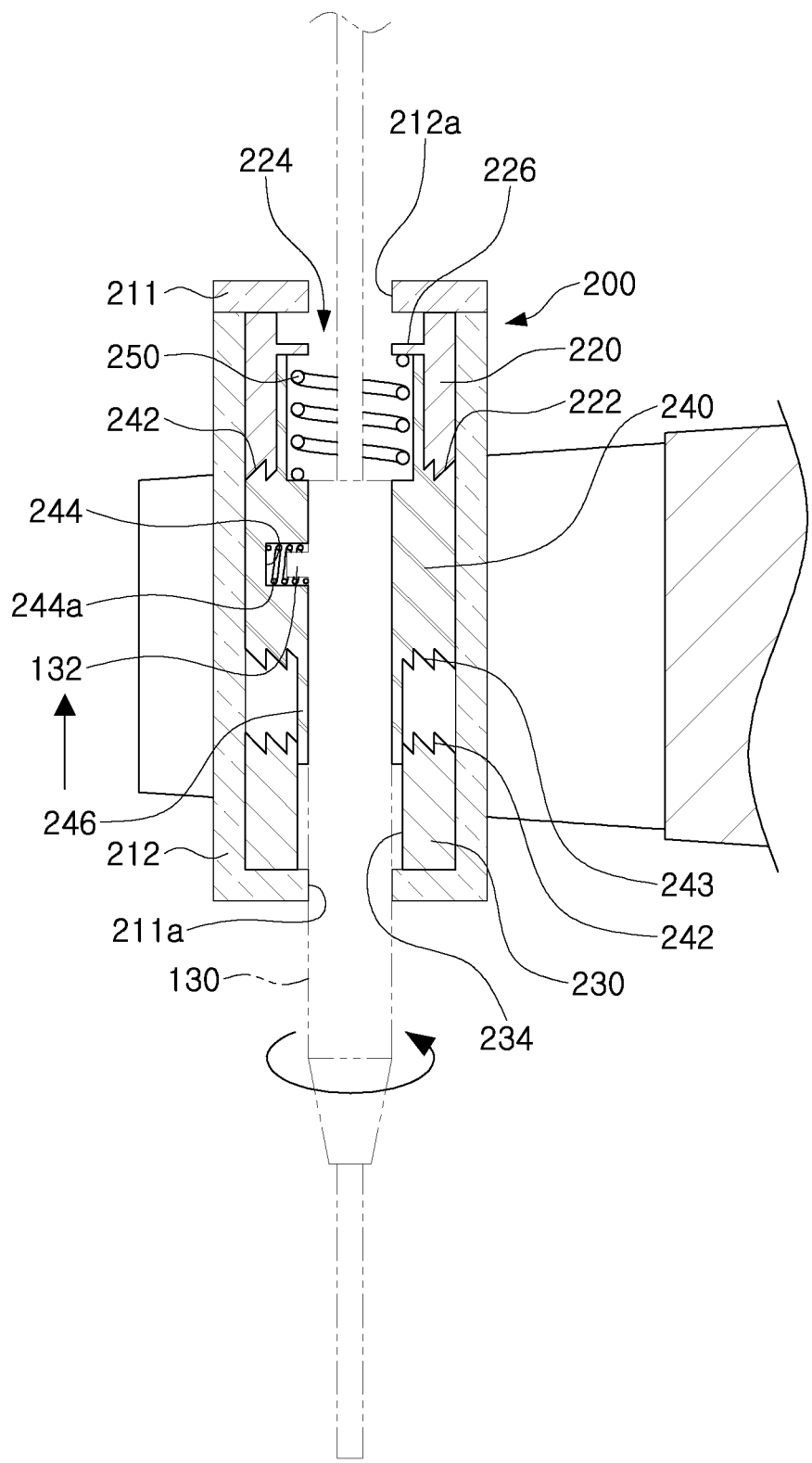
Figure 6:
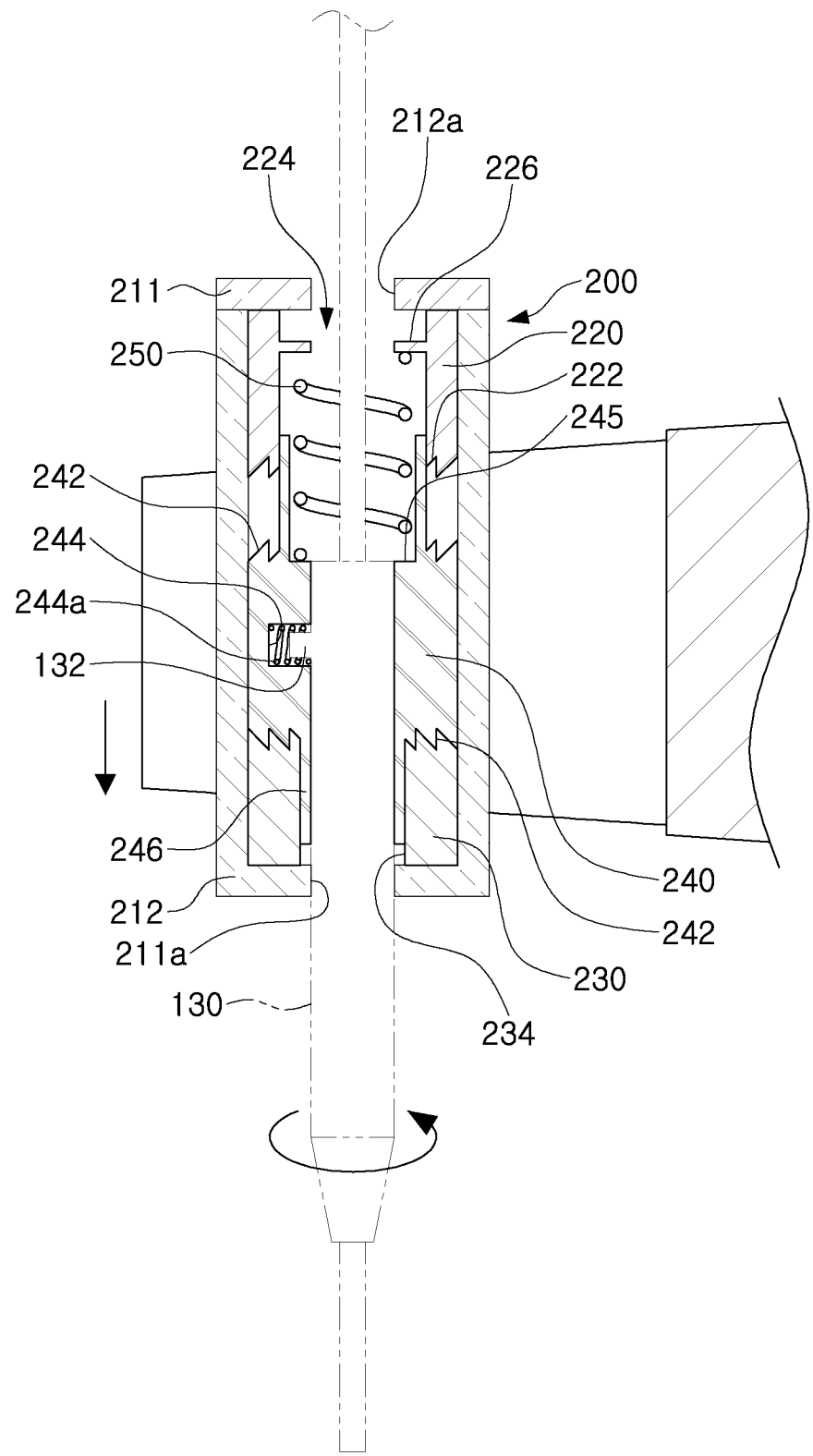

FIGS. 4 to 6 are explanatory views for explaining the operation of the clamp and the capillary according to the example embodiment.

First, referring to FIG. 4, before the wire bonding process is performed, the capillary 130 is in a non-pressurized state. At this time, as illustrated in FIG. 4, the capillary 130 is coupled to the second member 230 together with the third member 240. At this time, the second gear unit 232 of the second member 230 and the fourth gear unit 243 of the third member 240 maintain a coupled state.

Thereafter, a wire bonding process is performed and, and when the bonding pad 102a of the semiconductor chip 102 seated on the bonding stage 110 or the lead 101a of the substrate 101, illustrated in FIG. 1, is pressurized by the capillary 130, the third member 240 to which the capillary 130 is fixedly installed is raised as illustrated in FIG. 5. Accordingly, the third gear unit 242 of the third member 240 and the first gear unit 222 of the first member 220 are coupled. As described above, while the third gear unit 242 of the third member 240 and the first gear unit 222 of the first member 220 are gear-coupled, the third member 240 is rotated in one direction. Accordingly, the capillary 130 fixedly installed on the third member 240 is rotated together with the third member 240 in one direction.

Thereafter, when the capillary 130 does not press the bonding pad 102a of the semiconductor chip 102 seated on the bonding stage 110 or the lead 101a of the substrate 101, the third member 240 descends by the restorative force of the elastic member 250 as illustrated in FIG. 6. Accordingly, as the second gear unit 232 of the second member 230 and the fourth gear unit 243 of the third member 240 are coupled, the third member 240 is rotated as illustrated in FIG. 6. Accordingly, the capillary 130 fixedly installed on the third member 240 is rotated together with the third member 240 in one direction.

As described above, the capillary 130 is rotated in one direction in conjunction with the second member 230 according to the elevation of the second member 230. The lifespan of the capillary 130 may be increased. For example, since the positive voltage applied to the capillary 130 is uniformly applied as the capillary 130 rotates, it is possible to reduce the stress concentration generated by the spark being unbalanced. Accordingly, build-up generated by being biased on the capillary 130, for example, foreign material deposition may be reduced, such that the lifespan of the capillary 130 may be increased.

Furthermore, by reducing the build-up that is generated by being biased on the capillary 130, when forming a Free Air Ball (FAB), it is possible to reduce the formation of the ball biased. Accordingly, it is possible to reduce the problem of ball deformation occurring during the wire bonding process.

As set forth above, example embodiments of describe a wire bonding apparatus capable of extending the lifespan of a capillary While aspects of example embodiments have been particularly shown described, it will be understood that various changes and details may be made therein without departing from the spirit and scope of the following claims.

What is claimed is:

1. A wire bonding apparatus comprising:
a bonding stage;
a capillary guiding a bonding wire to a bonding pad of a semiconductor chip seated on the bonding stage;
a clamp provided with the capillary rotatably installed thereon; and
a bonding arm connected to the clamp;
wherein the clamp comprises:
a housing having an internal space;
a first member fixedly installed at an upper end of the internal space of the housing and comprising a first gear unit on a lower surface thereof;
a second member fixedly installed at a lower end of the internal space of the housing to be spaced apart from the first member, and comprising a second gear unit on an upper surface thereof;
a third member disposed between the first member and the second member, the third member comprising a third gear unit corresponding to the first gear unit and a fourth gear unit corresponding to the second gear unit; and
an elastic member biasing the third member away from the second member,
wherein the capillary is fixedly installed on the third member and rotates in conjunction with the third member.

2. The wire bonding apparatus of claim 1, wherein the third member is rotated in one direction when the first gear unit and the third gear unit are coupled, and is rotated in the one direction when the second gear unit and the fourth gear unit are coupled.

3. The wire bonding apparatus of claim 1, wherein teeth of the first gear unit and the third gear unit comprise a right-angled triangle shape in cross section.

4. The wire bonding apparatus of claim 3, wherein the teeth of the first gear unit and the third gear unit have the same gear ratio.

5. The wire bonding apparatus of claim 3, wherein teeth of the second gear unit and the fourth gear unit comprise a right-angled triangle shape in cross section.

6. The wire bonding apparatus of claim 5, wherein the teeth of the second gear unit and the fourth gear unit have the same gear ratio.

7. The wire bonding apparatus of claim 1, wherein the capillary comprises a protrusion which is inserted into a coupling groove of the third member.

8. The wire bonding apparatus of claim 7, further comprising a spring in the coupling groove biasing the capillary towards a predetermined position.

9. The wire bonding apparatus of claim 1, wherein the first member comprises a first through-hole through which the bonding wire passes, and the second member comprises a second through-hole through which the capillary passes.

10. The wire bonding apparatus of claim 1, wherein the elastic member comprises a coil spring, and
a first end of the elastic member is supported on an upper surface disposed inside the third gear unit of the third member, and a second end of the elastic member is supported by a protrusion protruding to an inner surface of the first member.

11. The wire bonding apparatus of claim 10, wherein the third member comprises an extension portion extending in a vertical direction inside the third and fourth gear units.

12. A wire bonding apparatus comprising:
a capillary guiding a bonding wire to a bonding pad of a semiconductor chip; and
a clamp provided with the capillary rotatably installed thereon,
wherein the clamp comprises:
a housing having an internal space;
a first member fixedly installed at an upper end of the internal space of the housing and provided with a first gear unit on a lower surface thereof;
a second member fixedly installed at a lower end of the internal space of the housing to be spaced apart from the first member, and provided with a second gear unit on an upper surface thereof;
a third member disposed between the first member and the second member, the third member provided with the capillary fixedly installed thereon; and
an elastic member connected to the second member to bias the second member,
the third member is rotated by the first gear unit of the first member when ascending and is rotated by the second gear unit of the second member when descending, and
the third member is configured to be rotated in only one direction.

13. The wire bonding apparatus of claim 12, wherein the third member comprises a third gear unit corresponding to the first gear unit and a fourth gear unit corresponding to the second gear unit,
wherein the first gear unit and the third gear unit have the same gear ratio, and
the second gear unit and the fourth gear unit have the same gear ratio.

14. The wire bonding apparatus of claim 13, wherein the first gear unit, the second gear unit, the third gear unit and the fourth gear unit have a right-angled triangular cross-section.

15. The wire bonding apparatus of claim 13, wherein the capillary comprises a protrusion inserted into a coupling groove of the third member.

16. A wire bonding apparatus comprising:
- a bonding stage;
- a clamp;
- a capillary rotatably installed on the clamp and configured to guide a bonding wire to a bonding pad of a semiconductor chip seated on the bonding stage;
- a bonding arm connected to the clamp;
- wherein the clamp comprises:
  - a housing having an internal space;
  - a first member installed at an upper end of the internal space of the housing and comprising a first gear unit at a lower surface thereof;
  - a second member installed at a lower end of the internal space of the housing and comprising a second gear unit on an upper surface thereof;
  - a third member disposed between the first member and the second member and movable relative to the first member and the second member, the third member comprising a third gear unit configured to selectively engage the first gear unit and a fourth gear unit configured to selectively engage the second gear unit; and
- wherein the capillary is installed on the third member and rotates in conjunction with the third member.

17. The wire bonding apparatus of claim 16, wherein the third member is configured to rotate in a first direction when the third gear unit is engaged with the first gear unit, and
wherein the third member is configured to rotate in the first direction when the fourth gear unit is engaged with the second gear unit.

18. The wire bonding apparatus of claim 17, wherein the third member comprises a coupling groove, and
wherein the capillary comprises a projection that projects into the coupling groove.

19. The wire bonding apparatus of claim 18, further comprising a biasing member disposed at least partially in the coupling groove.

20. The wire bonding apparatus of claim 17, wherein the third member comprises an extension portion that extends inside the first member and the second member.

* * * * *